(12) United States Patent
Maeda et al.

(10) Patent No.: US 6,248,499 B1
(45) Date of Patent: *Jun. 19, 2001

(54) (METH)ACRYLATE, POLYMER, PHOTORESIST COMPOSITION, AND PATTERN FORMING PROCESS MAKING USE OF THE COMPOSITION

(75) Inventors: Katsumi Maeda; Shigeyuki Iwasa; Kaichiro Nakano; Etsuo Hasegawa, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/058,349

(22) Filed: Apr. 10, 1998

(30) Foreign Application Priority Data

Apr. 16, 1997 (JP) .................................................. 9-099064

(51) Int. Cl.$^7$ ..................................................... G03F 7/004
(52) U.S. Cl. ........................ 430/270.1; 430/910; 526/284
(58) Field of Search ................................ 430/270.1, 910; 526/284

(56) References Cited

U.S. PATENT DOCUMENTS

| | | | |
|---|---|---|---|
| 4,387,182 | * 6/1983 | Friedli et al. | 525/244 |
| 5,091,492 | * 2/1992 | Ishidoya et al. | 526/282 |
| 5,665,518 | * 9/1997 | Maeda et al. | 430/270.1 |
| 5,851,727 | * 12/1998 | Choi et al. | 430/270.1 |
| 6,030,747 | * 2/2000 | Nakano et al. | 430/270.1 |

FOREIGN PATENT DOCUMENTS

| | | |
|---|---|---|
| 2-27760 | 6/1990 | (JP) . |
| 5-134416 | 5/1993 | (JP) . |
| 8-259626 | 10/1996 | (JP) . |
| 9-34118 | 2/1997 | (JP) . |

OTHER PUBLICATIONS

Hiroshi Ito et al., "Applications of Photoinitiators to the Design of Resists for Semiconductor Manufacturing", American Chemical Society, 1984, pp. 11–22.

Satoshi Takeuchi et al., "Alicyclic Polymer for ArF and KrF Excimer Resist Based on Chemical Amplification", Journal of Photopolymer Science and Technology, vol. 5, No.3, 1992, pp. 439–445.

R.D. Allen et al., "Resolution and Etch Resistance of a Family of 193 nm Positive Resists", Journal of Photopolymer Science and Technology, vol. 8, No. 4, 1995, pp. 623–636.

Naomi Shida et al., "Novel ArF Excimer Laser Resists Based on Menthyl Methacrylate Terpolymer", Journal of Photopolymer Science and Technology, vol. 9, No. 3, 1996, pp. 457–464.

Donald C. Hofer et al., "193 nm Photoresist R&D: The Risk & Challenge", Journal of Photopolymer Science and Technology, vol. 9, No. 3, 1996, pp. 387–397.

R.D. Allen et al., "Progress in 193 nm Positive Resists", Journal of Photopolymer Science and Technology, vol. 9, No. 3, 1996, pp. 465–474.

* cited by examiner

*Primary Examiner*—John S. Chu
(74) *Attorney, Agent, or Firm*—Young & Thompson

(57) ABSTRACT

A photoresist composition contains a photoacid generator and a polymer represented by the following formula:

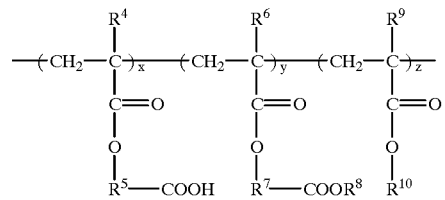

wherein $R^4$, $R^6$ and $R^9$ each represents a hydrogen atom or a methyl group, $R^5$ and $R^7$ each represents a $C_{17-23}$ divalent hydrocarbon group containing a bridged cyclic hydrocarbon group, $R^8$ represents an acid-decomposable group, $R^{10}$ represents a hydrogen atom or a $C_{1-12}$ hydrocarbon group, x+y+z equals to 1, and x, y and z stand for 0 to 1, 0 to 1, and 0 to 0.9, respectively, and having a weight average molecular weight of from 1,000 to 500,000. According to the present invention, a chemical modification photoresist composition having high transparency to radiation of 220 nm and shorter and improved in etching resistance can be provided.

4 Claims, No Drawings

(METH)ACRYLATE, POLYMER, PHOTORESIST COMPOSITION, AND PATTERN FORMING PROCESS MAKING USE OF THE COMPOSITION

BACKGROUND OF THE INVENTION

1. Field of the Invention

This invention relates to a (meth)acrylate, a polymer, a photoresist composition, and a pattern forming process making use of the composition. More specifically, the present invention is concerned with a photoresist composition and a pattern forming process, which are suitable for use in a lithographic step in the fabrication of a semiconductor device, especially in lithography making use of radiation of 220 nm or shorter in wavelength as exposure radiation.

2. Description of the Related Art

In the field of fabrication of various electronic devices requiring small geometry processing of the half micron order and led by semiconductor devices, there is an ever-increasing demand toward devices of still higher density and integration. This has led to still severer requirements for lithographic technology which is adopted for the formation of submicrometer patterns.

As one of measures for achieving miniaturization of a pattern, there is an approach to shorten the wavelength of exposure radiation which is used upon formation of a resist pattern. For a mass-fabrication process of 256 Mb DRAMs (processing dimension: <0.25 μm), use of KrF excimer laser (wavelength: 248 nm) of shorter wavelength than i-line (wavelength: 365 nm) as an exposure radiation source in place of i-line is positively considered these days.

However, a radiation source of a still shorter wavelength is considered to be needed for the fabrication of DRAMs having an integration degree of 1 Gb or higher which requires still smaller geometry processing technology (processing dimension: <0.18 μm). In particular, use of photolithography making use of ArF excimer laser (wavelength: 193 nm) has been reported recently (Donald C. Hoffer, et al., Journal of Photopolymer Science and Technology, 9(3), 387–397 (1996).

There is accordingly an outstanding desire for the development of a resist which can be successfully employed in photolithography making use of ArF radiation. Such an ArF exposure resist is required to achieve an improvement in the cost performance of laser because, inter alia, the gas life of the excimer laser light source is short and a laser apparatus itself is expensive.

In addition to such a high resolution as permitting a still further reduction in the processing dimension, the ArF resist is also required to exhibit still higher sensitivity. As a method for providing a resist with higher sensitivity, chemical amplification making use of a photoacid generator as a sensitizer is known widely. As a representative example, JP Kokoku 2-27660 discloses a resist which is composed, in combination, of triphenylsulfonium hexafluoroarsenate and poly(p-tert-butoxycarbonyloxy-α-methylstyrene). Chemical modification resists are now extensively employed as KrF eximer laser resists [for example, Hiroshi Ito, C. Grantwillson, American Chemical Society Symposium Series 242, 11–23 (1984)]. A chemically amplified resist is characterized in that protonic acid, which is generated from a photoacid generator as a component of the resist upon exposure to radiation, undergoes an acid-catalyzed reaction with a resist resin or the like when subjected to a heat treatment after the exposure. As a result, chemically amplified resists have attained far higher sensitivity over conventional resists the photoreaction efficiencies (reactions per photon) of which are lower than 1. Nowadays, most of newly developed resists are of the chemically amplified type, and the adoption of a chemical amplification mechanism has become indispensable in the development of a high-sensitivity material which can meet the trend toward an exposure radiation source of shorter wavelength.

In lithography making use of radiation of a short wavelength of 220 nm or shorter led by ArF eximer laser, however, a resin component of a chemically amplified photoresist for use in the formation of submicrometer patterns is required to have new properties unsatisfiable by conventional materials, that is, high transparency for exposure light of 220 nm or shorter and resistance to dry etching.

In the conventional lithography which uses g-beam (438 nm), i-line (365 nm) or KrF eximer laser (248 nm), a resin having an aromatic ring in its structural units, such as a novolac resin or poly(p-vinylphenol), is used as a resin component of a photoresist composition, so that the resin is allowed to exhibit resistance to etching owing to the dry etching resistance of these aromatic rings. However, a resin containing aromatic rings shows extremely strong absorption for radiation of a wavelength shorter than 220 nm. Exposure radiation is therefore mostly absorbed at a resist surface and is unable to pass to a substrate, so that no submicrometer resist pattern can be formed. Conventional resins cannot accordingly be applied to photolithography which makes use of short-wavelength radiation of 220 nm or shorter. As a consequence, there is an outstanding strong desire for a resin material which does not contain aromatic rings, has etching resistance, and is transparent to wavelengths of 220 nm and shorter.

Proposed examples of high molecular compounds having transparency to ArF eximer laser (193 nm) and dry etching resistance include a copolymer containing adamantyl methacrylate units, which is an alicyclic polymer [Takechi, et al., Journal of Photopolymer Science and Technology, 5(3), 439–446 (1992)], a copolymer containing isobornyl methacrylate units [R. D. Allen, et al., Journal of Photopolymer Science and Technology, 8(4), 623–636 (1995); ibid., 9(3), 465–474 (1996)], and a copolymer containing menthyl methacrylate units [Shida, et al., Journal of Photopolymer Science and Technology, 9(3), 457–464 (1996)].

In the above-exemplified resins, however, adamantyl-containing residue units, isobornyl-containing residue units or menthyl-containing residue units—which possess dry etching resistance—do not contain residual groups which can exhibit a difference between the solubility before exposure and that after the exposure. In addition, these alicyclic groups do not contain groups (for example, carboxyl groups) which provide the resins with solubility in an aqueous alkaline solution and also with adhesion to substrates. Accordingly, a homopolymer of a monomer containing an alicyclic group has high hydrophobicity and poor adhesion to substrates under processing (for example, silicon substrates) and can hardly form uniform coating films with good reproducibility. Moreover, due to the lack of any residual groups which make it possible to exhibit a difference between a dissolution rate before exposure and that after the exposure, no pattern can be formed by exposure. The above-described resins can hence be used as resin components in resists only when they are converted into copolymers with a comonomer capable of exhibiting a difference in solubility, such as t-butyl methacrylate or tetrahydropyranyl methacrylate, or with a comonomer capable of imparting substrate adhesion such as methacrylic acid. These comonomers have considerably low dry etching resistance and, nonetheless, their contents are required to be as high as about 50 mole %. Accordingly, such copolymers are significantly reduced in dry etching resistance and have little utility as dry-etching-resistant resins.

There is accordingly a strong desire for a new resist resin material, which has high transparency to radiation of 220 nm or shorter, possesses high etching resistance, contains functional groups permitting exhibition of a difference between the solubility before exposure and that after the exposure, permits development in an aqueous alkaline solution after exposure, and is equipped with improved substrate adhesion.

As a novel resin capable of satisfying these requirements, the present inventors already developed the resin disclosed in JP Kokai 8-259626. A further improvement in dry etching resistance is however desired.

SUMMARY OF THE INVENTION

An object of the present invention is therefore to provide a chemically amplified photoresist composition—which is suitable for use in lithography making use of exposure radiation of 220 nm or shorter, especially of 180 to 220 nm, can exhibit a difference between the solubility before exposure and that after the exposure, permits development in an aqueous alkaline solution after exposure, possesses high substrate adhesion, has high transparency to radiation of 220 nm or shorter, and is equipped with improved etching resistance—and also to provide a pattern forming process making use of the photoresist composition.

The present invention thus relates to a (meth)acrylate represented by the following formula (1):

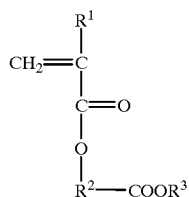

(1)

wherein $R^1$ represents a hydrogen atom or a methyl group, $R^2$ represents a $C_{17-23}$ divalent hydrocarbon group containing a bridged cyclic hydrocarbon group, and $R^3$ represents an acid-decomposable group or a hydrogen atom.

This invention also pertains to a polymer available by homopolymerization of the (meth)acrylate represented by the formula (1) or copolymerization of the (meth)acrylate with another copolymerizable compound and having a weight average molecular weight of from 1,000 to 500,000.

This invention is also concerned with a polymer represented by the following formula (2):

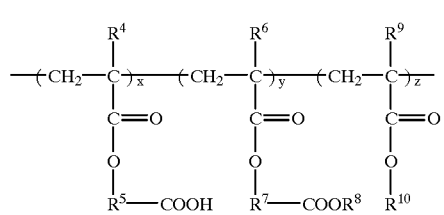

(2)

wherein $R^4$, $R^6$ and $R^9$ each represents a hydrogen atom or a methyl group, $R^5$ and $R^7$ each represents a $C_{17-23}$ divalent hydrocarbon group containing a bridged cyclic hydrocarbon group, $R^8$ represents an acid-decomposable group, $R^{10}$ represents a hydrogen atom or a $C_{1-12}$ hydrocarbon group, x+y+z equals to 1, and x, y and z stand for 0 to 1, 0 to 1, and 0 to 0.9, respectively, and having a weight average molecular weight of from 1,000 to 500,000.

This invention also relates to a photoresist composition comprising 70 to 99.8 wt. % of one of the above-described polymers of the present invention and 0.2 to 30 wt. % of a photoacid generator capable of generating an acid upon exposure to radiation.

According to the present invention, it is possible to provide a photoresist material, which can exhibit a difference between the solubility before exposure and that after the exposure, permits development in an aqueous alkaline solution after exposure, possesses high substrate adhesion, has high transparency to radiation of 220 nm or shorter, and is equipped with excellent etching resistance, thereby making it possible to form submicrometer patterns by ArF eximer laser beam in the fabrication of semiconductor devices.

DETAILED DESCRIPTION OF THE PREFERRED EMBODIMENTS

The present invention will hereinafter be described in detail by its embodiments.

In the formula (1), $R^1$ represents a hydrogen atom or a methyl group, and $R^2$ represents a $C_{17-23}$ divalent hydrocarbon group containing a bridged cyclic hydrocarbon group. Specific examples of $R^2$ can include hexacyclo[6.6.1.1$^{3,6}$.1$^{10,13}$.0$^{2,7}$.0$^{9,14}$]heptadecanediyl, methylhexacyclo[6.6.1.1$^{3,6}$.1$^{10,13}$.0$^{2,7}$.0$^{9,14}$]heptadecanediyl, octacyclo[8.8.0.1$^{2,9}$.1$^{4,7}$.1$^{11,18}$.1$^{13,16}$.0$^{3,8}$.0$^{12,17}$]docosanediyl, methyloctacyclo[8.8.0.1$^{2,9}$.1$^{4,7}$.1$^{11,18}$.1$^{13,16}$.0$^{3,8}$.0$^{12,17}$]docosanediyl groups, as shown in Table 1.

$R^3$ represents a hydrogen atom or an acid-decomposable group. Specific examples can include t-butyl, tetrahydropyran-2-yl, tetrahydrofuran-2-yl, 4-methoxytetrahydropyran-4-yl, 1-ethoxyethyl, 1-butoxyethyl, 1-propoxyethyl, and 3-oxocyclohexyl groups.

As an example of polymers available by homopolymerization of the (meth)acrylate represented by the formula (1) or copolymerization of the (meth)acrylate with another copolymerizable compound, the polymer represented by the formula (2) can be mentioned.

In the formula (2), $R^4$, $R^6$ and $R^9$ each represents a hydrogen atom or a methyl group. $R^5$ and $R^7$ each represents a $C_{17-23}$ divalent hydrocarbon group containing a bridged cyclic hydrocarbon group. Specific examples can include hexacyclo[6.6.1.1$^{3,6}$.1$^{10,13}$.0$^{2,7}$.0$^{9,14}$]heptadecanediyl, methylhexacyclo[6.6.1.1$^{3,6}$.1$^{10,13}$.0$^{2,7}$.0$^{9,14}$]heptadecanediyl, octacyclo[8.8.0.1$^{2,9}$.1$^{4,7}$.1$^{11,18}$.1$^{13,16}$.0$^{3,8}$.0$^{12,17}$]docosanediyl and methyloctacyclo[8.8.0.1$^{2,9}$.1$^{4,7}$.1$^{11,18}$.1$^{13,16}$.0$^{3,8}$.0$^{12,17}$]docosanediyl groups, as shown in Table 1.

$R^8$ represents an acid-decomposable group. Specific examples can include t-butyl, tetrahydropyran-2-yl, tetrahydrofuran-2-yl, 4-methoxytetrahydropyran-4-yl, 1-ethoxyethyl, 1-butoxyethyl, 1-propoxyethyl, and 3-oxocyclohexyl groups.

$R^{10}$ represents a hydrogen atom or a $C_{1-12}$ hydrocarbon group. Specific examples can include methyl, ethyl, n-propyl, isopropyl, n-butyl, isobutyl, t-butyl, cyclohexyl, dimethylcyclohexyl, tricyclo[5.2.1.0$^{2,6}$]decyl, norbonyl, adamantyl, and isobornyl groups.

TABLE 1

| $R^2, R^5, R^7$ | Chemical structure of group |
|---|---|
| Hexacyclo[6.6.1.1$^{3,6}$.1$^{10,13}$.0$^{2,7}$.0$^{9,14}$] heptadecanediyl group | |
| Methylhexacyclo(6.6.1.1$^{3,6}$.1$^{10,13}$.0$^{2,7}$.0$^{9,14}$] heptadecanediyl group | —CH$_3$ |
| Octacyclo[8.8.0.1$^{2,9}$.1$^{4,7}$.1$^{11,18}$.1$^{13,16}$.0$^{3,8}$.0$^{12,17}$]- docosanediyl group | |
| Methyloctacyclo[8.8.0.1$^{2,9}$.1$^{4,7}$.1$^{11,18}$.1$^{13,16}$.0$^{3,8}$.0$^{12,17}$] docosanediyl group | —CH$_3$ |

Among (meth)acrylates represented by the formula (1), a vinyl monomer of the formula (1) in which $R^1$ is a methyl group, $R^2$ is a hexacyclo[6.6.1.1$^{3,6}$.1$^{10,13}$.0$^{2,7}$.0$^{9,14}$] heptadecanediyl group, and $R^3$ is a tetrahydropyran-2-yl group can be synthesized, for example, as will be described hereinafter.

First, 8-methoxycarbonyltetracyclo[4.4.0.1$^{2,5}$.1$^{7,10}$]-3-dodecene and dicyclopentadiene are reacted at 170 to 180° C. for 17 hours, whereby methoxycarbonylhexacyclo [6.6.1.1$^{3,6}$.1$^{10,13}$.0$^{2,7}$.0$^{9,14}$]heptadecene is obtained.

The methoxycarbonylhexacyclo[6.6.1.1$^{3,6}$.1$^{10,13}$.0$^{2,7}$.0$^{9,14}$]heptadecene is next subjected to alkaline hydrolysis, followed by the protection of the carboxyl group with a tetrahydropyranyl group so that tetrahydropyranyloxycarbonylhexacyclo[6.6.1.1$^{3,6}$.1$^{10,13}$.0$^{2,7}$.0$^{9,14}$] is obtained.

Further, one hydroxyl group is introduced per molecule by using a boran-tetrahydrofuran complex, followed by the reaction with methacryloyl chloride, whereby the target methacrylate is obtained.

The polymer, which is available by homopolymerization of the (meth)acrylate represented by the formula (1) or copolymerization of the (meth)acrylate represented by the formula (1) with another copolymerizable compound, can be obtained by a conventional polymerization process such as radical polymerization or ionic polymerization. This polymerization can be conducted, for example, by stirring the (meth)acrylate by itself or in combination with the another copolymerizable monomer under heat at 50 to 70° C. for 0.5 to 12 hours in dry tetrahydrofuran under an atmosphere of an inert gas (argon, nitrogen or the like) in the presence of a suitable radical polymerization initiator [for example, azobisisobutyronitrile (AIBN); monomer/initiator molar ratio: 8 to 200] added therein.

Further, the weight average molecular weight of the polymer according to the present invention ranges from 1,000 to 500,000, with 5,000 to 200,000 being more preferred. A copolymer having desired composition, molecular weight and the like can be obtained by choosing the charge ratio of monomers for the copolymer and other polymerization conditions.

The photoacid generator, which is an essential element of each photoresist composition according to the present invention, may desirably be a photochemical acid generator which generates an acid upon exposure to radiation of 400 nm or shorter, preferably radiation in a range of from 180 nm to 220 nm. Any photoacid generator is usable, insofar as its mixture with the above-described high molecular compound or the like in the present invention is sufficiently soluble in an organic solvent and the resulting solution can be formed into a uniform coating film by a film-forming method such as spin coating. Such photochemical acid generators can be used either singly or in combination.

Examples of photoacid generators usable in the present invention can include the triphenylsulfonium salt derivatives described by J. V. Crivello et al. in Journal of the Organic Chemistry, 43(15), 3055–3058 (1978), onium salts including the triphenylsulfonium salt derivatives as typical examples (for example, compounds such as sulfonium salts, iodonium salts, phosphonium salts, diazonium salts and ammonium salts), 2,6-dinitrobenzyl esters [O. Nalamasu, et al., SPIE Proceedings, 1262, 32 (1990)], 1,2,3-tri (methanesulfonyloxy)benzene (Takumi Ueno, et al., Proceedings of PME '89, 413–424, Kodansha Ltd. (1990)], and sulfosuccimides disclosed in JP Kokai 5-134416.

The content of the photoacid generator is generally from 0.2 to 30 parts by weight, preferably from 1 to 15 parts by weight per 100 parts of the whole components including itself. A content smaller than 0.2 part by weight may lead to a significant reduction in sensitivity, thereby making it difficult to form patterns. On the other hand, a content greater than 30 parts by weight may develop problems such that the formation of a uniform coating film becomes difficult and a residue (scam) tends to occur after development.

The content of the polymer is generally from 70 to 99.8 parts by weight, preferably 85 to 99 parts by weight per 100 parts by weight of the whole components including itself.

Any solvent can be used suitably in the present invention, insofar as it is an organic solvent capable of achieving sufficient dissolution of the polymer and the photoacid generator and the resulting solution can be formed into a uniform coating film by a coating method such as spin coating. Such solvents can be used either singly or in combination. Specific examples can include, but are not limited to, n-propyl alcohol, isopropyl alcohol, n-butyl alcohol, tert-butyl alcohol, methylcellosolve acetate, ethylcellosolve acetate, propylene glycol monoethyl ether acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, and diethylene glycol dimethyl ether.

Although the "basic" components of the photoresist composition of the present invention are the above-described photoacid generator, resin and solvent, one or more of other components such as dissolution inhibitors, surfactant, pigments, stabilizers, coating property improvers and dyes may also be added as needed.

Each photoresist composition according to the present invention is usable as a new photoresist material having high transparency to radiation of 220 nm or shorter, high dry etching resistance and improved substrate adhesion. Use of the photoresist composition according to the present invention in lithography making use of far ultraviolet radiation of 220 nm or shorter as exposure radiation makes it possible to form submicrometer patterns.

The present invention also relates to process for forming a pattern, which comprises the following steps: coating a substrate with the photoresist composition of the present invention, exposing the thus-coated photoresist composition to radiation having a wavelength of from 180 to 220 nm, baking the thus-exposed photoresist composition, and then developing the thus-baked photoresist composition. In this process, prebaking may be conducted after the coating step if desired. Further, the exposure radiation may desirably be ArF eximer laser.

The present invention will hereinafter be described further by Examples. It is however to be noted that the present invention is not limited to or by them.

EXAMPLE 1

Synthesis of a methacrylate of the formula (1) in which $R^1$ is a methyl group, $R^2$ is a hexacyclo[$6.6.1.1^{3,6}.1^{10,13}.0^{2,7}.0^{9,14}$]heptadecanediyl group, and $R^3$ is a tetrahydropyran-2-yl group.

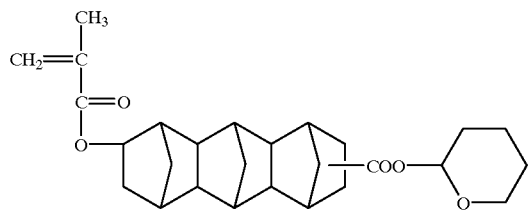

Into a 300-ml eggplant-type flask, 65 g of 8-methoxycarbonyltetracyclo[$4.4.0.1^{2,5}.1^{7,10}$]-3-dodecene, 87 g of dicyclopentadiene and 0.14 g of methylhydroquinone were added, followed by a reaction at 170 to 180° C. for 17 hours.

After the reaction mixture was allowed to cool down, the reaction mixture was distilled under reduced pressure so that unreacted 8-methoxycarbonyltetracyclo[$4.4.0.1^{2,5}.1^{7,10}$]-3-dodecene and dicyclopentadiene were eliminated. Hot methanol was then added to the residue, an insoluble matter was filtered off, and the resulting filtrate was concentrated under reduced pressure. The residue was recrystallized from methanol, whereby 10 g of 12-methoxycarbonylhexacyclo[$6.6.1.1^{3,6}.1^{10,13}.0^{2,7}.0^{9,14}$]heptadecene were obtained as white crystals.

Next, 3.6 g of the 12-methoxycarbonylhexacyclo[$6.6.1.1^{3,6}.1^{10,13}.0^{2,7}.0^{9,14}$]heptadecene were dissolved in 30 ml of 95% ethanol, into which 1.25 g of potassium hydroxide were added. The resultant mixture was then heated under reflux. Two hours later, the reaction mixture was allowed to cool down and was then concentrated to ⅓ volume in an evaporator. Water (50 ml) and ether (50 ml) were added, and the resultant water layer was separated. When the water layer was acidified with 3% HCl, a white precipitate was formed. The precipitate was collected by filtration and was then washed with water until the washing became neutral, whereby 2.2 g of 12-carboxyhexacyclo[$6.6.1.1^{3,6}.1^{10,13}.0^{2,7}.0^{9,14}$]heptadecene were obtained.

Next, 2.1 g of the 12-carboxyhexacyclo[$6.6.1.1^{3,6}.1^{10,13}.0^{2,7}.0^{9,14}$]heptadecene and 1.71 g of 3,4-dihydro-2H-pyran were dissolved in 50 ml of tetrahydrofuran, into which 0.03 g of p-toluenesulfonic acid were added. The resultant mixture was reacted at room temperature for 2 hours. The reaction mixture was diluted with 100 ml of ethyl ether, followed by the successive washing with a 3% aqueous solution of $Na_2CO_3$, 3% aqueous solution of sodium chloride, and water. An organic layer was dried over $MgSO_4$. The ethyl ether and unreacted 3,4-dihydro-2H-pyran were distilled off under reduced pressure by an evaporator, whereby 2 g of 12-tetrahydropyranyloxycarbonylhexacyclo[$6.6.1.1^{3,6}.1^{10,13}.0^{2,7}.0^{9,14}$]heptadecene were obtained as a viscous liquid.

Further, the 2 g of the 12-tetrahydropyranyloxycarbonylhexacyclo[$6.6.1.1^{3,6}.1^{10,13}.0^{2,7}.0^{9,14}$]heptadecene were dissolved in 8 ml of dry THF, followed by cooling to 0° C. After the atmosphere was purged with argon, 6 ml of a 1 M solution of a boran-THF complex in THF were added dropwise. Subsequent to stirring at 0° C. for 1 hour, the mixture was stirred further at room temperature for 1 hour. The resultant mixture was then cooled to 0° C., to which 0.5 ml of water was added dropwise, followed by the further dropwise addition of 1.1 ml of a 3 M aqueous solution of NaOH and 0.7 ml of 30% $H_2O_2$ at temperatures not higher than 20° C. After the thus-obtained mixture was stirred at room temperature for 1.5 hours, the water layer was saturated with NaCl, followed by the dilution with 100 ml of ethyl ether. The resulting ether layer was washed with a saturated aqueous solution of sodium chloride and water and dried over $MgSO_4$. The ethyl ether was then distilled off, whereby 2 g of hydroxy-tetrahydropyranyl oxycarbonylhexacyclo[$6.6.1.1^{3,6}.1^{10,13}.0^{2,7}.0^{9,14}$] were obtained.

Then, the 2 g of the hydroxy-tetrahydropyranyloxycarbonylhexacyclo[$6.6.1.1^{3,6}.1^{10,13}.0^{2,7}.0^{9,14}$] and 0.53 g of pyridine were dissolved in 8 ml of dry THF. After the resultant solution was cooled to 0° C., a solution of 0.7 g of methacryloyl chloride in 1 ml of THF was added dropwise. Subsequent to stirring for 1 hour, the mixture was allowed to react further overnight at room temperature. The precipitated pyridine hydrochloride was filtered off. The filtrate was diluted with 20 ml of ethyl ether. The resulting solution was washed successively with 0.5 N hydrochloric acid, a saturated aqueous solution of sodium chloride, a 3% aqueous solution of $Na_2CO_3$, and a saturated aqueous solution of sodium chloride, and was then dried over $MgSO_4$. The ethyl ether was distilled off under reduced pressure and the residue was subjected to column fractionation [hexane/ethyl acetate=5/1 (by volume), adsorbent: silica gel], whereby 2 g of the target methacrylate were obtained as a viscous liquid. IR ($cm^{-1}$): 3048, 2940($\upsilon$CH), 1740, 1713 ($\upsilon$C=O), 1640($\upsilon$C=C), 1168($\upsilon$C—O).

EXAMPLE 2

Synthesis of a methacrylate of the formula (1) in which $R^1$ is a methyl group, $R^2$ is a hexacyclo[$6.6.1.1^{3,6}.1^{10,13}.0^{2,7}.0^{9,14}$]heptadecanediyl group, and $R^3$ is a hydrogen atom.

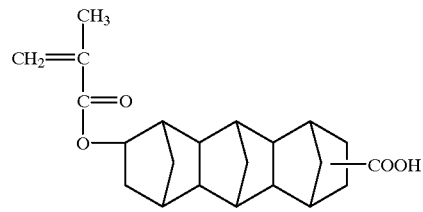

Two grams of the methacrylate obtained in Example 1 were dissolved in 14 ml of a mixed solvent of acetic acid, tetrahydrofuran and water (4/2/1 by volume), followed by a reaction at 40 to 45° C. for 45 minutes. The reaction mixture as poured into 250 ml of ice water. Precipitated crystals were collected by filtration, washed several times with water, and then washed with hexane, whereby 0.79 g of the target product was obtained. $^1$H-NMR (CDCl$_3$, internal standard: tetramethylsilane) ppm: 1.0–1.88(m), 1.93–2.75(m), 1.91 (3H,s), 4.99(1H,s), 5.51(1H,s), 6.04(1H,s), 9.5–11.3(1H,br). IR (cm$^{-1}$): 2800–3600(υOH), 2950, 3048(υCH), 1712 (υC=O), 1634(υC=C), 1172 (υC—O).

EXAMPLE 3

Synthesis of a methacrylate of the formula (1) in which R$^1$ is a methyl group, R$^2$ is a hexacyclo[6.6.1.1$^{3,6}$.1$^{10,13}$.0$^{2,7}$.0$^{9,14}$]heptadecanediyl group, and R$^3$ is a t-butyl group.

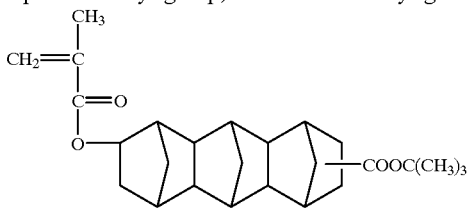

Five grams of the methacrylate described in Example 2 and obtained as in Example 2 were dissolved in 20 ml of toluene, followed by cooling to 0° C. Into the resultant solution, 5.9 g of trifluoroacetic anhydride were added dropwise and further, 6.2 g of t-butyl alcohol were added dropwise. The resultant mixture was reacted for 1 hour under ice cooling. The reaction mixture as poured into 100 ml of ice water. An organic layer was extracted with 100 ml of ethyl ether, and the extract was washed successively with a 5% aqueous solution of NaOH, a saturated aqueous solution of sodium chloride and water. After the organic layer was dried over magnesium sulfate, the ethyl ether was distilled off under reduced pressure. The residue was purified by chromatography on a silica gel column (developer: hexane/ethyl acetate=5/1 by volume), whereby 2 g of the target product was obtained as a viscous liquid. IR (cm$^{-1}$): 3040, 2959(υCH), 1720(υC=O), 1631(υC=C), 1156 (υC—O).

EXAMPLE 4

Synthesis of a methacrylate of the formula (1) in which R$^1$ is a methyl group, R$^2$ is a hexacyclo[6.6.1.1$^{3,6}$.1$^{10,13}$.0$^{2,7}$.0$^{9,14}$]heptadecanediyl group, and R$^3$ is an ethoxyethyl group.

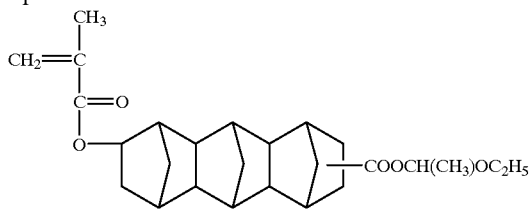

Two grams of the methacrylate described in Example 2 and obtained as in Example 2 and 1 g of ethyl vinyl ether were dissolved in 10 ml of methylene chloride, into which 0.028 g of pyridinium p-toluenesulfonate was added, followed by a reaction at room temperature. Two hours later, the reaction mixture was diluted with 40 ml of ethyl ether, followed by successive washing with a 3% aqueous solution of sodium carbonate, a saturated aqueous solution of sodium chloride and water. After an organic layer was dried over magnesium sulfate, the ethyl ether and unreacted ethyl vinyl ether were distilled off, whereby 2 g of the target product was obtained as a viscous liquid. IR (cm$^{-1}$): 3040, 2950 (υCH), 1720(υC=O), 1634(υC=C), 1170(υC—O).

EXAMPLE 5

Synthesis of an acrylate of the formula (1) in which R$^1$ is a hydrogen atom, R$^2$ is a hexacyclo[6.6.1.1$^{3,6}$.1$^{10,13}$.0$^{2,7}$.0$^{9,14}$]heptadecanediyl group, and R$^3$ is an tetrahydropyran-2-yl group.

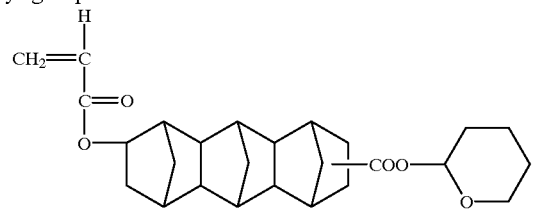

A synthesis was conducted in a similar manner as in Example 1 except for the use of acryloyl chloride in place of methacryloyl chloride, whereby the target product was obtained. IR (cm$^{-1}$): 3050, 2940(υCH), 1739, 1710 (υC=O), 1636, 1618(υC=C), 1170 (υC—O).

EXAMPLE 6

Synthesis of a methacrylate of the formula (1) in which R$^1$ is a methyl group, R$^2$ is a methylhexacyclo[6.6.1.1$^{3,6}$.1$^{10,13}$.0$^{2,7}$.0$^{9,14}$]heptadecanediyl group, and R$^3$ is a tetrahydropyran-2-yl group.

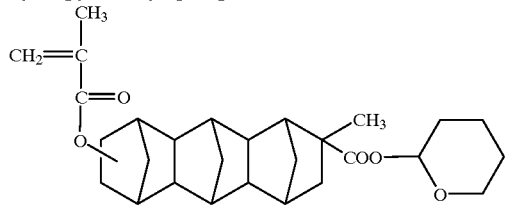

A synthesis was conducted in a similar manner as in Example 1 except for the use of 8-methyl-8-methoxycarbonyltetracyclo[4.4.0.1$^{2,5}$.1$^{7,10}$]-3-dodecene in lieu of 8-methoxycarbonyltetracyclo[4.4.0.1$^{2,5}$.1$^{7,10}$]-3-dodecene, whereby the target product was obtained. IR (cm$^{-1}$): 3050, 2945(υCH), 1739, 1713(υC=O), 1640 (υC=C), 1168(υC—O).

EXAMPLE 7

Synthesis of a methacrylate of the formula (1) in which R$^1$ is a methyl group, R$^2$ is an octacyclo[8.8.0.1$^{2,9}$.1$^{4,7}$.1$^{11,18}$.1$^{13,14}$.0$^{3,8}$.0$^{12,17}$]-docosanediyl group, and R$^3$ is a tetrahydropyran-2-yl group.

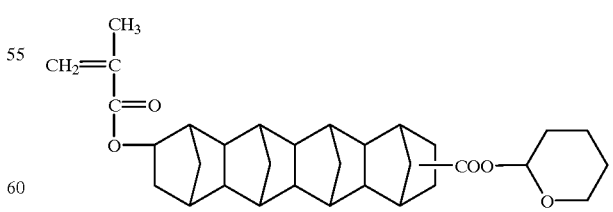

A synthesis was conducted in a similar manner as in Example 1 except for the use of 12-methoxycarbonylhexacyclo[6.6.1.1$^{3,6}$.1$^{10,13}$.0$^{2,7}$.0$^{9,14}$] heptadecene, the synthesis intermediate in Example 1, instead of 8-methoxycarbonyltetracyclo[4.4.0.1$^{2,5}$.1$^{7,10}$]-3- dodecene, whereby the target product was obtained. IR (cm$^{-1}$): 3050, 2940(υCH), 1740, 1715(υC=O), 1636 (υC=C), 1170(υC—O).

EXAMPLE 8

Synthesis of a polymer of the methacrylate described in Example 2, said polymer being represented by the formula (2) in which $R^4$ is a methyl group, $R^5$ is a hexacyclo[6.6.1.1$^{3,6}$.1$^{10,13}$.0$^{2,7}$.0$^{9,14}$]heptadecanediyl group, y is 0, and z is 0.

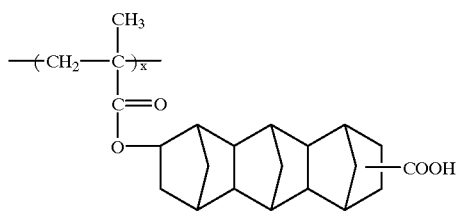

In a 100-ml eggplant-type flask, 3.9 g of the methacrylate obtained as in Example 2 were dissolved in 30 ml of dry tetrahydrofuran, into which 196 mg of AIBN were added. The resultant mixture was stirred at 60 to 65° C. under an argon gas atmosphere. Ten hours later, the reaction mixture was allowed to cool down and was then poured into 300 ml of ligroin. The resulting precipitate was collected by filtration. The precipitate was purified once more by reprecipitation, whereby 2.34 g of the target product were obtained (yield: 60%). Its weight average molecular weight (Mw) as determined by GPC was 24,300 (calculated based on polystyrene).

EXAMPLE 9

Synthesis of a copolymer of the methacrylate described in Example 1 and the methacrylate described in Example 2, said copolymer being represented by the formula (2) in which $R^4$ and $R^6$ are methyl groups, $R^5$ and $R^7$ are hexacyclo[6.6.1.1$^{3,6}$.1$^{10,13}$.0$^{2,7}$.0$^{9,14}$]heptadecanediyl groups, $R^8$ is a tetrahydropyran-2-yl group, x is 0.5, y is 0.5, and z is 0.

In a 100-ml eggplant-type flask, 2 g of the methacrylate obtained as in Example 1 and 1.62 g of the methacrylate obtained as in Example 2 were dissolved in 30 ml of dry tetrahydrofuran, into which 196 mg (40 mmol/l) of AIBN were added. The resultant mixture was stirred at 60 to 65° C. under an argon gas atmosphere. One hour later, the reaction mixture was allowed to cool down and was then poured into 300 ml of ligroin. The resulting precipitate was collected by filtration. The precipitate was purified once more by reprecipitation, whereby 1.92 g of the target product were obtained (yield: 53%). Its weight average molecular weight (Mw) as determined by GPC was 21,500. The values of x and y were determined by $^1$H-NMR.

EXAMPLES 10 & 11

Polymerization was conducted as in Example 9 except that the charge ratio of the methacrylate described in Example 1 to the methacrylate described in Example 3 was changed. The copolymerization ratios (x/y) and weight average molecular weights of the resultant polymers are shown in Table 2.

TABLE 2

| Example | Charge ratio | x/y | Weight average molecular weight |
| --- | --- | --- | --- |
| 10 | 0.2/0.8 | 0.21/0.79 | 20,800 |
| 11 | 0.8/0.2 | 0.82/0.18 | 21,900 |

EXAMPLES 12 & 13

Polymerization was conducted as in Example 9 except that the amount (concentration) of AIBN was changed. The copolymerization ratios (x/y) and weight average molecular weights of the resultant polymers are shown in Table 3.

TABLE 3

| Example | Concentration of AIBN | x/y | Weight average molecular weight |
| --- | --- | --- | --- |
| 12 | 10 mmol/l | 0.49/0.51 | 84,000 |
| 13 | 80 mmol/l | 0.5/0.5 | 6,400 |
| 9 | 40 mmol/l | 0.5/0.5 | 21,500 |

EXAMPLE 14

Synthesis of a copolymer of the methacrylate described in Example 2 and the methacrylate described in Example 5,

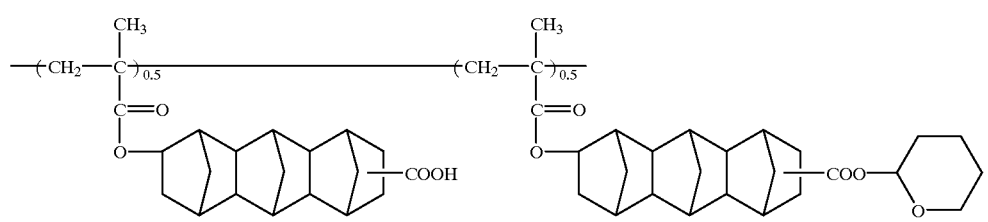

said copolymer being represented by the formula (2) in which $R^4$ is a methyl group, $R^6$ is a hydrogen atom, $R^5$ and $R^7$ are hexacyclo[6.6.1.1$^{3,6}$.1$^{10,13}$.0$^{2,7}$.0$^{9,14}$]heptadecanediyl groups, $R^8$ is a tetrahydropyran-2-yl group, x is 0,5, y is 0.5, and z is 0.

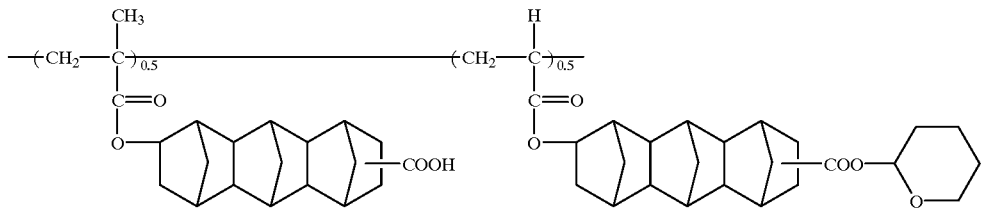

The title copolymer was synthesized as in Example 9 except for the use of the acrylate described in Example 5 instead of the methacrylate described in Example 1. Its weight average molecular weight was 22,000.

EXAMPLE 15

Synthesis of a copolymer of the methacrylate described in Example 2 and the methacrylate described in Example 6, said copolymer being represented by the formula (2) in which $R^4$ and $R^6$ are methyl groups, $R^5$ is a hexacyclo[$6.6.1.1^{3,6}.1^{10,13}.0^{2,7}.0^{9,14}$]heptadecanediyl group, $R^7$ is a methylhexacyclo[$6.6.1.1^{3,6}.1^{10,13}.0^{2,7}.0^{9,14}$]heptadecanediyl group, $R^8$ is a tetrahydropyran-2-yl group, x is 0.5, y is 0.5, and z is 0.

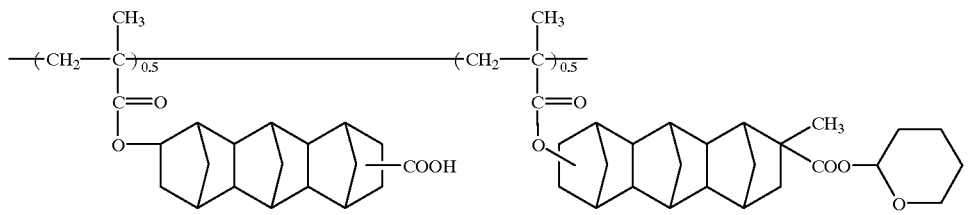

The title copolymer was synthesized as in Example 9 except for the use of the methacrylate described in Example 6 instead of the methacrylate described in Example 1. Its weight average molecular weight was 21,200.

EXAMPLE 16

Synthesis of a copolymer of the methacrylate described in Example 2 and the methacrylate described in Example 3, said copolymer being represented by the formula (2) in which $R^4$ and $R^6$ are methyl groups, $R^5$ and $R^7$ are hexacyclo[$6.6.1.1^{3,6}.1^{10,13}.0^{2,7}.0^{9,14}$]heptadecanediyl groups, $R^8$ is a tert-butyl group, x is 0.5, y is 0.5, and z is 0.

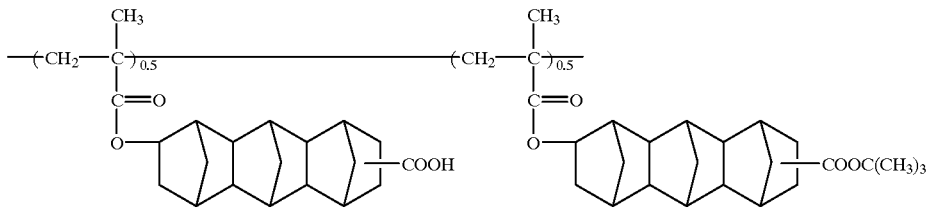

The title copolymer was synthesized as in Example 9 except for the use of the methacrylate described in Example 3 instead of the methacrylate described in Example 1. Its weight average molecular weight was 23,500.

EXAMPLE 17

Synthesis of a copolymer of the methacrylate described in Example 2 and the methacrylate described in Example 4, said copolymer being represented by the formula (2) in which $R^4$ and $R^6$ are methyl groups, $R^5$ and $R^7$ are hexacyclo[$6.6.1.1^{3,6}.1^{10,13}.0^{2,7}.0^{9,14}$]heptadecanediyl groups, $R^8$ is an ethoxyethyl group, x is 0.5, y is 0.5, and z is 0.

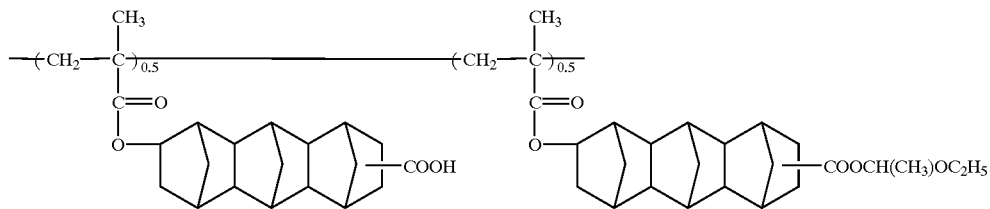

The title copolymer was synthesized as in Example 9 except for the use of the methacrylate described in Example 4 instead of the methacrylate described in Example 1. Its weight average molecular weight was 20,600.

EXAMPLE 18

Synthesis of a copolymer of the methacrylate described in Example 2 and the methacrylate described in Example 7, said copolymer being represented by the formula (2) in which $R^4$ and $R^6$ are methyl groups, $R^5$ is a hexacyclo[6.6.1.1$^{3,6}$.1$^{10,13}$.0$^{2,7}$.0$^{9,14}$]heptadecanediyl groups, $R^7$ is a methyloctacyclo[8.8.0.1$^{2,9}$.1$^{4,7}$.1$^{11,18}$.1$^{13,16}$.0$^{3,8}$.0$^{12,17}$]docosanediyl, $R^8$ is a tetrahydropyran-2-yl group, x is 0.5, y is 0.5, and z is 0.

The title copolymer was synthesized as in Example 9 except for the use of the methacrylate described in Example 7 instead of the methacrylate described in Example 1. Its weight average molecular weight was 24,300.

EXAMPLE 19

Synthesis of a terpolymer of the methacrylate described in Example 1, the methacrylate described in Example 2 and tricyclo[5.2.1.0$^{2,6}$]decyl methacrylate, said terpolymer being represented by the formula (2) in which $R^4$, $R^6$ and $R^9$ are methyl groups, $R^5$ and $R^7$ are hexacyclo[6.6.1.1$^{3,6}$.1$^{10,13}$.0$^{2,7}$.0$^{9,14}$]heptadecanediyl groups, $R^8$ is a tetrahydropyran-

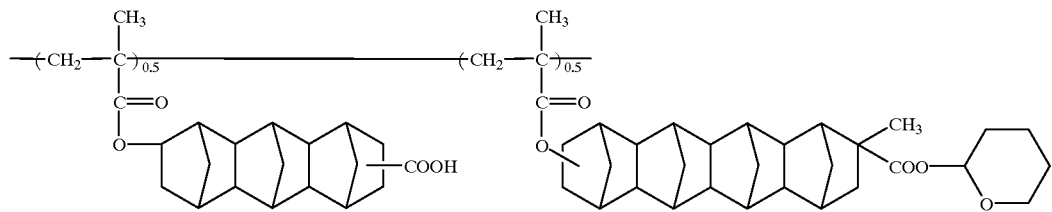

2-yl group, $R^{10}$ is a tricyclo[5.2.1.0$^{2,6}$]decyl group, x is 0.5, y is 0.3, and z is 0.2.

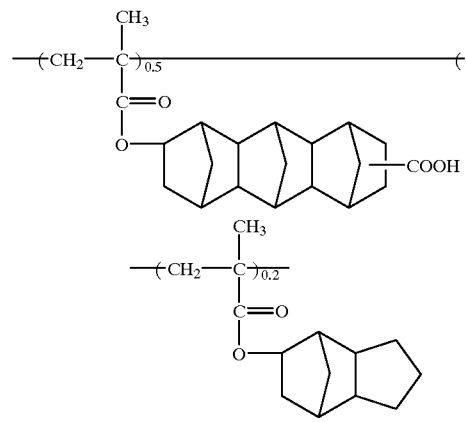

In a 100-ml eggplant-type flask, 3 g of the methacrylate described in Example 1, 4.05 g of the methacrylate described in Example 2 and 1 g of tricyclo[5.2.1.0$^{2,6}$]decyl methacrylate (product of Hitachi Chemical Co., Ltd.; Product No. FA-513M) were dissolved in 66 ml of dry tetrahydrofuran, into which 433 mg (40 mmol/l) of AIBN were added. The resultant mixture was stirred at 60 to 65° C. under an argon gas atmosphere. One hour later, the reaction mixture was allowed to cool down and was then poured into 700 ml of ligroin. The resulting precipitate was collected by filtration. The precipitate was purified once more by reprecipitation, whereby 4.2 g of the target product were obtained (yield: 52%). Its weight average molecular weight was 23,800.

EXAMPLE 20

Two grams of the copolymer described in Example 9 were dissolved in 10 g of diethylene glycol dimethyl ether, followed by filtration through a 0.2-$\mu$m TEFLON filter. The thus-prepared solution was next spin-coated on a 3-inch silicon wafer. Baking was then conducted for 60 seconds on a hot plate of 90° C., whereby a thin film of 0.7 $\mu$m in thickness was formed.

Using a reactive ion etching (RIE) apparatus ("DEM 451", trade name; manufactured by Anelva Corporation), the etch rate of the thus-obtained thin film by CF$_4$ gas was measured. As etching conditions, the power, pressure and gas flow rate were set at 100 W, 5 Pa and 30 sccm, respectively. The results are shown in Table 4.

Similarly, the etch rates of the copolymer and terpolymer obtained in Examples 18 and 19, respectively, were measured. The results are also shown in Table 4. The measurement result of a coating film of a resin as a reference example, which is disclosed in JP Kokai 8-259626 and represented by the following structure (the number of carbons in each bridging cyclic hydrocarbon group: 10):

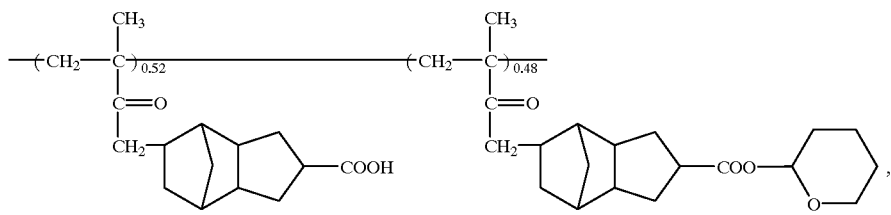

is also presented in Table 4. Further, the measurement results of coating films of a novolac resin ("PFI-15A", trade name; product of Sumitomo Chemical Co., Ltd.), poly(vinylphenol) used as a base resin in KrF resists and poly(methyl methacrylate) as a resin containing no bridging cyclic hydrocarbon groups in its molecular structure, as comparative examples, are also presented in Table 4. Incidentally, the etch rate of each polymer is shown as a relative value by assuming that the etch rate of the novolac resist is 1.

TABLE 4

| | Etch rate (relative value) |
|---|---|
| Polymer of Example 9 | 0.95 |
| Polymer of Example 18 | 0.90 |
| Polymer of Example 19 | 0.85 |
| Referential Example | 1.2 |

TABLE 4-continued

| | Etch rate (relative value) |
|---|---|
| Poly(methyl methacrylate) | 1.9 |
| Poly(vinylphenol) | 1.2 |
| Novolac resist (PFI-15A) | 1 |

From the above-described results, it is readily envisaged that each polymer according to the present invention has a low etch rate for CF$_4$ gas and is hence excellent in dry etching resistance. From a comparison with the referential example, it is also appreciated that etching resistance can be improved further by increasing the numbers of carbon atoms in the bridging hydrocarbon groups represented by R$^5$ and R$^7$ in the formula (2)—in the present invention, the number of carbons is 17 to 23.

EXAMPLES 21 & 22

A resist of the following composition was prepared.

| | | |
|---|---|---|
| (a) | Polymer (Example 9) | 2 g |
| (b) | Photoacid generator (triphenylsulfonium triflate) | 0.02 g |
| (c) | Diethylene glycol dimethyl ether | 10.5 g |

The above mixture was filtered through a 0.2-$\mu$m TEFLON filter to prepare a resist. The resist was spin-coated on a 3-inch quartz substrate and was then baked at 90° C. for 1 minute on a hot plate, whereby a thin film of 1 $\mu$m in thickness was formed.

Wavelength dependency of the transmittance of the thus-obtained thin film was measured by using a spectrophotometer for ultraviolet and visible region. The transmittance at 193.4 nm, which is a central wavelength of ArF excimer laser, is shown in Table 5.

A similar measurement was also conducted on the polymer obtained in Example 16.

As is shown in Table 5, each photoresist according to the present invention has been confirmed to show sufficient transparency as a single-layer resist.

TABLE 5

| | | Transmittance (%/$\mu$m) |
|---|---|---|
| Example 21 | Resist containing the polymer of Example 9 | 55 |
| Example 22 | Resist containing the polymer of Example 16 | 60 |

EXAMPLES 23 & 24

Using the resists prepared in Examples 21 and 22, respectively, films were formed to a thickness of 0.5 μm on Si substrates to prepare wafers. These wafers were placed in a laboratory contact exposure apparatus which had been fully purged with nitrogen gas. Masks, which were made of quartz plates and carried thereon patterns drawn with chromium thereon, were brought into close contact with the individual resist films. Through the masks, ArF excimer laser was irradiated. Immediately after the exposure, the resist films were baked at 90° C. for 60 seconds on a hot plate. Development was conducted for 60 seconds by the dipping method in a 0.238% aqueous solution of TMAH (tetramethylammonium hydroxide) of 23° C., followed by rinsing for 60 seconds with deionized water.

As a result, only exposed areas of the resist films were dissolved in the developer and were hence removed so that positive patterns were obtained. Further, the developed patterns were observed by a scanning electron microscope (SEM; "SE-4100", trade name; manufactured by Hitachi Ltd.). Problems such as pattern peeling were not observed. The results of measurements of their sensitivities and resolutions are shown in Table 6.

TABLE 6

| Ex. | | Resolution (μmL/S) | Sensitivity (mJ/cm$^2$) |
|---|---|---|---|
| 23 | Resist containing the polymer of Example 9 | 0.2 | 2 |
| 24 | Resist containing the polymer of Example 16 | 0.2 | 8 |

From the above results, each photoresist composition according to the present invention has been found to have excellent resolution characteristics. As problems such as pattern peeling did not take place, each photoresist composition according to the present invention has also been confirmed to be excellent in substrate adhesion.

What is claimed is:

1. A polymer available by homopolymerization of a (meth)acrylate represented by the following formula (1):

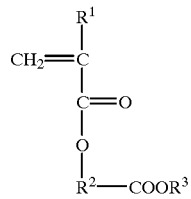

wherein $R^1$ represents a hydrogen atom or a methyl group, $R^2$ represents a $C_{17-23}$ divalent hydrocarbon group containing a bridged cyclic hydrocarbon group, and $R^3$ represents an acid-decomposable group or a hydrogen atom; or copolymerization of the (meth)acrylate with another copolymerizable compound and having a weight average molecular weight of from 1,000 to 500,000.

2. A polymer represented by the following formula (2):

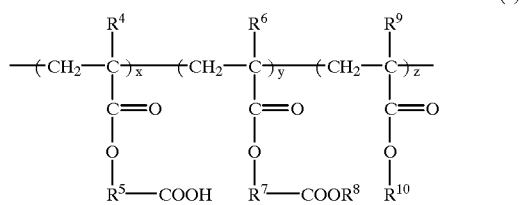

wherein $R^4$, $R^6$ and $R^9$ each represents a hydrogen atom or a methyl group, $R^5$ and $R^7$ each represents a $C_{17-23}$ divalent hydrocarbon group containing a bridged cyclic hydrocarbon group, $R^8$ represents an acid-decomposable group, $R^{10}$ represents a hydrogen atom or a $C_{1-12}$ hydrocarbon group, x+y+z equals to 1, and x, y and z stand for 0 to 1, 0 to 1, and 0 to 0.9, respectively, wherein at least one of x and y is greater than zero, and having a weight average molecular weight of from 1,000 to 500,000.

3. A photoresist composition comprising 70 to 99.8 wt. % of the polymer as defined in claim 1 and 0.2 to 30 wt. % of a photoacid generator capable of generating an acid upon exposure to radiation.

4. A photoresist composition comprising 70 to 99.8 wt. % of the polymer as defined in claim 2 and 0.2 to 30 wt. % of a photoacid generator capable of generating an acid upon exposure to radiation.

* * * * *